US009319061B1

(12) United States Patent
Azarmnia et al.

(10) Patent No.: US 9,319,061 B1
(45) Date of Patent: *Apr. 19, 2016

(54) APPARATUS AND METHODS FOR ACTIVE TERMINATION OF DIGITAL-TO-ANALOG CONVERTERS

(71) Applicant: ClariPhy Communications, Inc., Irvine, CA (US)

(72) Inventors: Morteza Azarmnia, Irvine, CA (US); Vadim Gutnik, Irvine, CA (US); William Vanscheik, Rancho Santa Margarita, CA (US)

(73) Assignee: ClariPhy Communications, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/575,864

(22) Filed: Dec. 18, 2014

Related U.S. Application Data

(63) Continuation of application No. 14/209,725, filed on Mar. 13, 2014, now Pat. No. 8,947,281.

(60) Provisional application No. 61/791,461, filed on Mar. 15, 2013.

(51) Int. Cl.
*H03M 1/66* (2006.01)
*H03M 1/00* (2006.01)
*H03K 19/00* (2006.01)

(52) U.S. Cl.
CPC ............. *H03M 1/66* (2013.01); *H03K 19/0005* (2013.01); *H03M 1/002* (2013.01)

(58) Field of Classification Search
CPC .................................. H03M 1/11; H03M 1/022
USPC .......................... 341/135, 118, 144, 153, 136
See application file for complete search history.

(56) References Cited

U.S. PATENT DOCUMENTS

| 6,977,602 | B1 | 12/2005 | Ostrem et al. |
| 8,253,526 | B2 | 8/2012 | Alexeyev et al. |
| 8,264,252 | B2 * | 9/2012 | Maruyama ...................... 326/30 |
| 8,446,191 | B2 | 5/2013 | Dunworth et al. |
| 8,710,963 | B2 | 4/2014 | Hammerschmidt |
| 8,786,478 | B1 | 7/2014 | Choi et al. |
| 8,947,281 | B1 | 2/2015 | Azarmnia et al. |
| 2009/0167747 | A1 | 7/2009 | Gong et al. |
| 2014/0266832 | A1 | 9/2014 | Schrom et al. |

* cited by examiner

*Primary Examiner* — Peguy Jean Pierre
(74) *Attorney, Agent, or Firm* — Knobbe Martens Olson & Bear LLP

(57) ABSTRACT

Apparatus and methods for digital-to-analog conversion are disclosed. In one embodiment, an electronic system includes a bias circuit and a digital-to-analog converter (DAC) including an input that receives a digital input signal and an output that drives a transmission line. The digital input signal can be used to control a magnitude and polarity of an output current of the DAC. The DAC further includes one or more p-type metal oxide semiconductor (PMOS) termination transistors that receive a first bias voltage from the bias circuit and one or more n-type metal oxide semiconductor (NMOS) termination transistors that receive a second bias voltage from the bias circuit. The bias circuit controls the voltage levels of the first and second bias voltages to control the termination transistors' small signal resistance to actively terminate the DAC's output.

20 Claims, 8 Drawing Sheets

APPARATUS AND METHODS FOR ACTIVE TERMINATION OF DIGITAL-TO-ANALOG CONVERTERS

CROSS-REFERENCE TO RELATED APPLICATIONS

This application is a continuation of U.S. application Ser. No. 14/209,725, filed Mar. 13, 2014, titled "APPARATUS AND METHODS FOR ACTIVELY TERMINATED DIGITAL-TO-ANALOG CONVERSION," which claims the benefit of priority under 35 U.S.C. §119(e) of U.S. Provisional Patent Application No. 61/791,461, filed Mar. 15, 2013 titled "HOST INGRESS TRANSMISSION DIGITAL-TO-ANALOG CONVERTER", each of which are herein incorporated by reference in their entirety.

BACKGROUND

1. Field

Embodiments of the invention relate to electronic systems, and in particular, to digital-to-analog conversion with impedance matching.

2. Description of the Related Technology

There has been widespread adoption of personal electronic devices including smart phones, tablets, notebooks, laptops, digital camera, video recorders, gaming systems, etc. These devices are being used to communicate ever-increasing quantities of data, such as between different personal electronic devices, between personal electronic devices and peripheral devices (e.g., display devices, external storage devices, etc.), and the like.

Enormous data communication demands are also present in a variety of other contexts. For example, data centers are communicating ever-increasing amounts of data, and also require fast and reliable data communication between devices. The various methods and systems disclosed herein provide various improvements and benefits vis-à-vis existing high-speed communication technologies.

SUMMARY

In one aspect, an apparatus is provided. The apparatus includes a first digital-to-analog converter (DAC) including a data input configured to receive a digital input signal and an output configured to generate an output current. The first DAC includes an active termination circuit including one or more p-type metal oxide semiconductor (PMOS) termination transistors and one or more n-type metal oxide semiconductor (NMOS) termination transistors. The apparatus further includes a bias circuit configured to generate a first bias voltage and a second bias voltage. The first bias voltage is configured to control a small signal resistance of the one or more PMOS termination transistors, and the second bias voltage is configured to control a small signal resistance of the one or more NMOS termination transistors. Additionally, the one or more PMOS termination transistors and the one or more NMOS termination transistors provide active termination to the output of the first DAC.

In another aspect, a method of electrical termination is provided. The method includes generating a first bias voltage and a second bias voltage using a bias circuit, biasing a gate of at least one PMOS termination transistor of a DAC using the first bias voltage, biasing a gate of at least one NMOS termination transistor of the DAC using the second bias voltage, and terminating an output of the DAC based on a small signal resistance of the at least one PMOS termination transistor and on a small signal resistance of the at least one NMOS termination transistor.

In another aspect, an apparatus is provided. The apparatus includes a DAC including a data input configured to receive a digital input signal and an output configured to generate an output current. The DAC includes an active termination circuit including one or more PMOS termination transistors and one or more NMOS termination transistors. The apparatus further includes a means for generating a first bias voltage and a second bias voltage. The first bias voltage is configured to control a small signal resistance of the one or more PMOS termination transistors, and the second bias voltage is configured to control a small signal resistance of the one or more NMOS termination transistors. Additionally, the one or more PMOS termination transistors and the one or more NMOS termination transistors provide active termination to the output of the first DAC.

BRIEF DESCRIPTION OF THE DRAWINGS

Example implementations disclosed herein are illustrated in the accompanying schematic drawings, which are for illustrative purposes only.

DETAILED DESCRIPTION OF EMBODIMENTS

The following detailed description is directed to certain implementations for the purposes of describing the innovative aspects. However, the teachings herein can be applied in a multitude of different ways. As will be apparent from the following description, the innovative aspects may be implemented in any high-speed communication system that is configured to transmit and receive data between electronic devices, which can include laptops, notebooks, tablets, desktop computers, data centers, gaming devices, data storage systems, input/output peripheral devices, display devices, etc. The innovative aspects may be implemented in or associated with data transport networks, storage area networks, enterprise networks, private networks, secure networks, financial networks, etc. Other uses are also possible.

Apparatus and methods for digital-to-analog conversion are disclosed herein. In certain implementations, an electronic system includes a bias circuit and a digital-to-analog converter (DAC) including an input that receives a digital input signal and an output that drives a transmission line. The digital input signal can be used to control a magnitude and polarity of an output current of the DAC. For example, the DAC can include an array of p-type metal oxide semiconductor (PMOS) current source transistors that can be used to source current and an array of n-type metal oxide semiconductor (NMOS) current source transistors that can be used to sink current, and the digital input signal can be used to selectively turn on and off transistors of the arrays to control the DAC's output current. The DAC further includes one or more PMOS termination transistors that receive a first bias voltage from the bias circuit and one or more NMOS termination transistors that receive a second bias voltage from the bias circuit. The bias circuit controls the voltage levels of the first and second bias voltages to control the termination transistors' small signal resistance to actively terminate the DAC's output.

The teachings herein can be used to provide, for example, enhanced performance and/or lower power consumption relative to certain conventional transmission line drivers. The DAC is actively terminated to lower power consumption, and receives a digital data input that can be controlled by a processor or other circuitry to generate an output signal associated with a particular communication interface standard or signaling protocol. In certain configurations, the DAC's bias circuit can operate using replica DAC circuitry, which can improve biasing accuracy of the termination transistors while avoiding performance degradation associated with loading the DAC's output with sensing circuitry.

Figure 1:
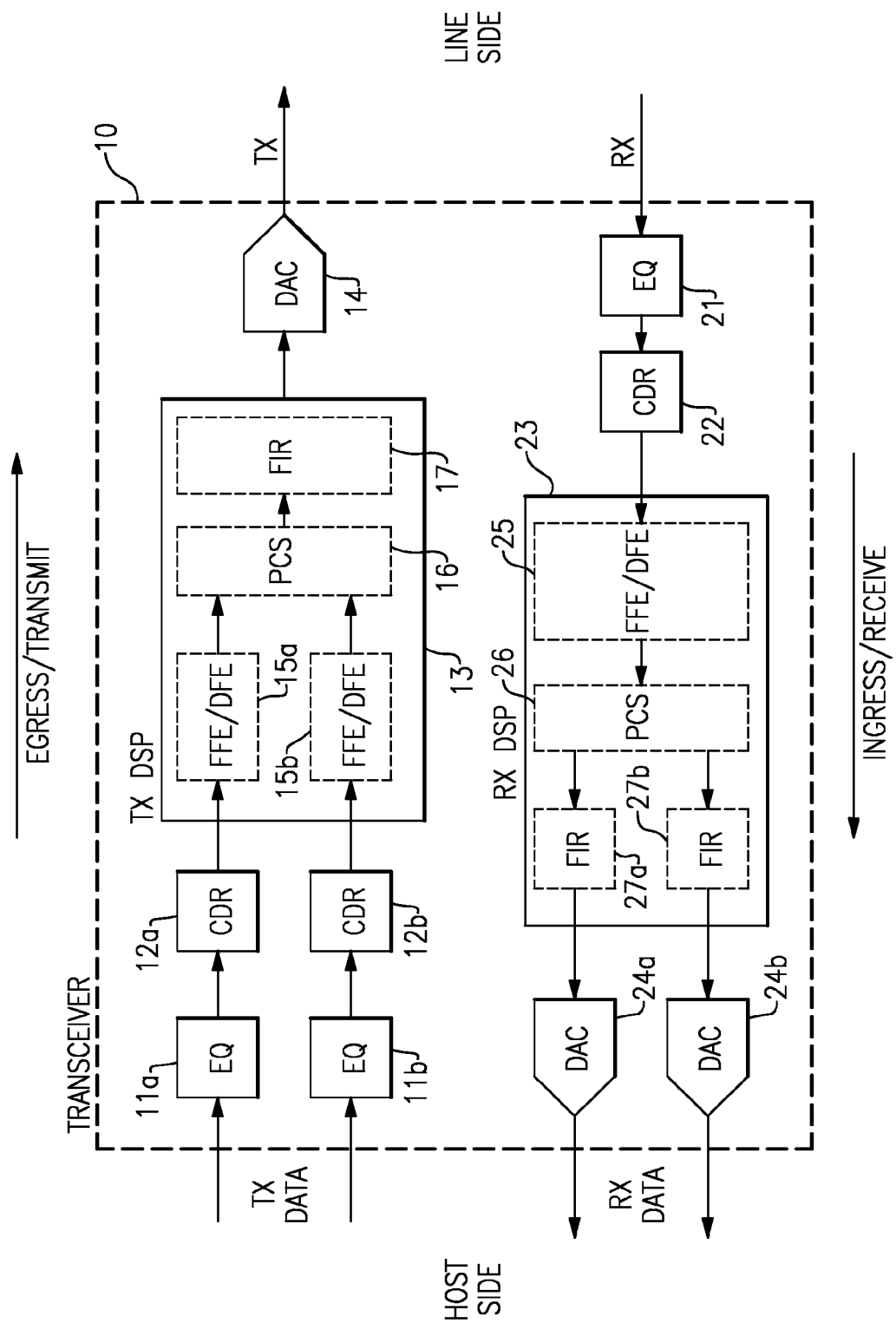
FIG. 1 is a schematic block diagram of one example of a transceiver.

FIG. 1 is a schematic block diagram of one example of a transceiver 10. The transceiver 10 includes a first transmit path equalizer 11a, a second transmit path equalizer 11b, a first transmit path clock and data recovery (CDR) circuit 12a, a second transmit path CDR circuit 12b, a transmit path digital signal processor (DSP) 13, a transmit path DAC 14, a receive path equalizer 21, a receive path CDR circuit 22, a receive path DSP 23, a first receive path DAC 24a, and a second receive path DAC 24b.

The transceiver 10 of FIG. 1 illustrates one example of an apparatus which can include one or more DACs implemented in accordance with the teachings herein. For example, the transmit path DAC 14, the first receive path DAC 24a, and/or the second receive path DAC 24b can be implemented in accordance with the embodiments described below with reference to FIGS. 2A-6. Although described in the context of the transceiver 10, the teachings herein are applicable to other systems or apparatus that include a DAC that drives a transmission line.

As shown in FIG. 1, the first and second transmit path equalizers 11a, 11b include inputs that receive host side transmit data (TX DATA) and outputs electrically connected to inputs of the first and second transmit path CDR circuits 12a, 12b, respectively. The first and second transmit path CDR circuits 12a, 12b further include outputs electrically connected to inputs of the transmit path DSP 13. The transmit path DAC 14 includes an input electrically connected to an output of the transmit path DSP 13 and an output that generates a line side transmit signal (TX). The receive path equalizer 21 includes an input that receives a line side receive signal (RX), and an output electrically connected to an input of the receive path CDR circuit 22. The receive path CDR circuit 22 further includes an output electrically connected to an input of the receive path DSP 23. The receive path DSP 23 further includes outputs electrically connected to inputs of the first and second receive path DACs 24a, 24b. The first and second receive path DACs 24a, 24b further include outputs that generate host side receive data (RX DATA).

The transceiver 10 can be used to support data transfer between various electronic devices, such as computing devices, storage devices, and/or peripheral devices. For example, the transceiver 10 can communicate with one or more additional transceivers using a wide variety of communications interface standards, including, for example, Thunderbolt Gen1/Gen2, USB 2.0/3.0, or IEEE 1394b.

In certain configurations, the transceiver 10 can implement a serializer/deserializer (SerDes) function. For example, in one embodiment, the transceiver 10 can operate as a full duplex multiplexer and re-timer capable of receiving multiple (e.g., 2, 4, or more) signals from a host via a host-side interface. Additionally, the transceiver 10 can multiplex the received host-side transmit signals for transmission via a line-side interface over a cable utilizing a reduced number of channels. The multiplexing reduces cabling cost and complexity, and can be achieved, for example, via multi-level modulation encoding. In one non-limiting example, the an egress/transmit path of the transceiver 10 is capable of receiving dual 20 Gbits/s non-return-to-zero (NRZ) signals on the host side and multiplexing these signals into a single 40 Gbits/s signal via four level pulse amplitude modulation (PAM-4) for transmission to the line side over the cable. Conversely, an ingress/receive path of the transceiver in such an example is capable of receiving a single 40 Gbits/s PAM-4 signal on the line side and demultiplexing this signal into dual 20 Gbit/s NRZ signals for communication to the host side.

FIG. 1 illustrates the host side transmit data as including two signals and the line side transmit data as including one signal (e.g., via a multiplexing operation), and illustrates the line side receive data as including one signal and the host side receive data as including two signals (e.g., via a demultiplexing operation). However, other configurations are possible, including configurations with additional signals on the host side and/or line side. For example, the first and second receive path DACs 24a, 24b can be replicated in parallel to include, for instance, 10, 20, or 40 or more DACs to provide wider RX DATA bandwidth. Similarly, the first and second transmit path equalizers 11a, 11b and the first and second transmit path CDR circuits 12a, 12b can be replicated in provide wider TX DATA bandwidth. In such configurations, different multiplexing, demultiplexing, and/or modulation formats can be employed, as appropriate.

The receive path equalizer 21 can be used to provide signal equalization to compensate for transmission line losses on the line side, and the first and second transmit path equalizers 11a, 11b can be used to provide signal equalization to compensate for transmission line losses on the host side. For example, in certain implementations, an equalizer can be used to compensate for high-frequency signal loss by boosting high frequency components of a signal relative to low frequency components of the signal, thereby improving signal fidelity. In certain configurations, an equalizer can also be used for balancing amplitude and/or frequency characteristics associated with non-inverted and inverted components of a differential signal.

The receive path CDR circuit 22 and the first and second transmit CDR circuits 12a, 12b can be used to perform clock and data recovery operations. For example, the receive path CDR circuit 22 can receive a data stream from the receive path equalizer 21, and can sample the data stream using a sampling clock signal. Additionally, the receive path CDR circuit 22 can control the sampling clock signal's frequency and phase to phase-align the sampling clock signal relative to transitions in the data stream. Similarly, the first and second transmit path CDR circuits 12a, 12b can recover data in data streams generated by the first and second transmit path equalizers 11a, 11b, respectively.

The receive path DSP 23 can be used to process the data recovered by the receive path CDR circuit 22, and the transmit path DSP 13 can be used to process the data recovered by the first and second transmit path CDR circuits 12a, 12b. In the illustrated configuration, the receive path DSP 23 includes a feed-forward equalizer and/or decision feedback equalizer (FFE/DFE) block 25, a physical coding sublayer (PCS) block 26, a first finite impulse response (FIR) filter 27a, and a second FIR filter 27b. Additionally, the transmit path DSP 13 includes a first FFE/DFE block 15a, a second FFE/DFE block 15b, a PCS block 16, and a FIR filter 17. Although one example of DSP blocks for receive path and transmit path DSPs has been provided, other configurations are possible.

The illustrated receive path and transmit path DSPs can aid in conditioning and recovering the received signal and in processing and generating signals associated with various communication interface standards or signaling protocols. For example, the transmit path DSP 13 can be used to filter and/or otherwise condition the received signal, and to process and combine multiple recovered data streams to generate a serialized output signal having a desired modulation format. For example, in one embodiment, transmit path DSP 13 can filter or otherwise recover and condition the received signal, and to process the received signal to output a digital signal of a desired format or encoding, such as PAM-4, NRZ, duobinary, differential phase-shift keying (DPSK), and/or phase-shift keying (PSK). Additionally, the receive path DSP 23 can be used to process (e.g., filter or otherwise recover and condition) data recovered by the receive path CDR circuit 22, and to deserialize the data to generate output signals having a desired modulation format for host side transmission.

In the illustrated configuration, the transmit path DAC 14 and the first and second receive path DACs 24a, 24b can be used to transmit signals generated by the transceiver 10 over transmission lines to other circuitry, such as other transceivers and/or receivers. For example, the transmit path DAC 14 can be used to convert a digital output signal generated by the transmit path DSP 13 into an analog output signal, which can be provided to another transceiver electrically coupled to the transceiver 10 on the line side by a transmission line. Depending on the environment, the transmission line can include, for example, cables, printed circuit board (PCB) trace, backplane trace, and/or other electrical interconnect associated with the transmission line. Similarly, the first and second receive path DACs 24a, 24b can be used to convert digital output signals generated by the receive path DSP 23 into analog output signals that can be provided to one or more additional transceivers electrically coupled to the transceiver 10 on the host side via transmission lines.

Although FIG. 1 illustrates one example of an electronic system that can include one or more DACs used to drive transmission lines, the teachings herein can be employed in a wide variety of other electronic systems.

For example, in other embodiments, one or more actively terminated DACs can be included in an optical transceiver system. Examples of compatible optical transceivers can be any of those shown and described in U.S. Provisional Application No. 61/791,461, which the present application claims priority to and which is incorporated by reference in its entirety herein. For instance, one or more actively terminated DACs in accordance with embodiments described herein could be incorporated in the optical transceiver 110 shown and described with reference to FIG. 3B of the '461 application, e.g., to generate Rx Data 326 and/or HI, HQ, VI, VQ output signals 392.

Figure 2A:
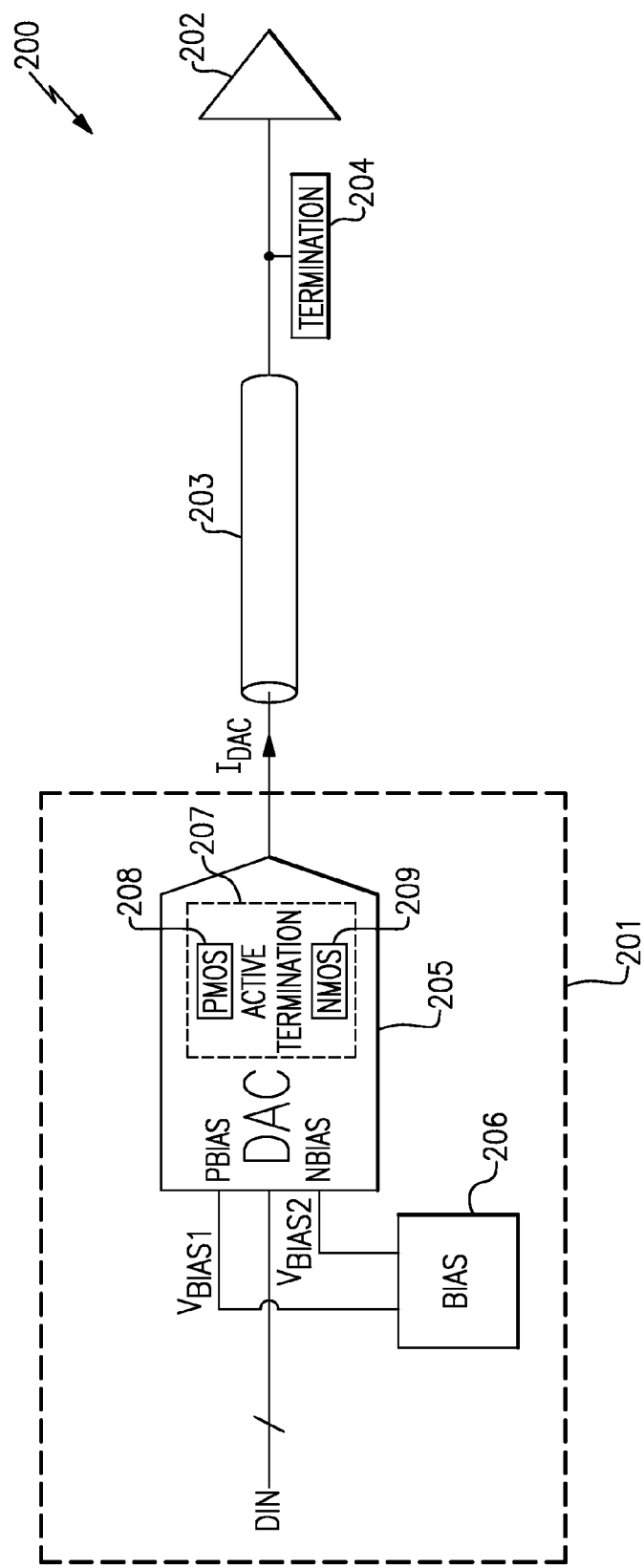
FIG. 2A is a schematic block diagram of an electronic system according to one embodiment.

FIG. 2A is a schematic block diagram of an electronic system 200 according to one embodiment.

The electronic system 200 includes a DAC transmitter 201, a receiver 202, a transmission line 203, and a termination circuit 204. The illustrated DAC transmitter 201 includes a digital-to-analog converter (DAC) 205 and a bias circuit 206. The DAC 205 includes a data input that receives a digital input signal DIN and an output electrically connected to a first end of the transmission line 203. The DAC 205 further includes a first bias input or PBIAS input that receives a first bias voltage $V_{BIAS1}$ generated by the bias circuit 206, and a second bias input or NBIAS input that receives a second bias voltage $V_{BIAS2}$ generated by the bias circuit 206. The transmission line 203 further includes a second end electrically connected to the termination circuit 204 and to an input of the receiver 202.

Although not illustrated in FIG. 2A for clarity, the electronic system 200 can include other components, inputs, and/or outputs.

The DAC transmitter 201 can communicate with the receiver 202 over the transmission line 203 using a variety of signaling techniques, including, but not limited to, PAM-4 or greater (e.g., PAM-8 or PAM-16), NRZ, duobinary, DPSK, and/or PSK.

The digital input signal DIN can be used to control a magnitude and a polarity of a DAC current $I_{DAC}$ generated at the output of the DAC 205. In certain implementations, the DAC 205 can include an array of p-type metal oxide semiconductor (PMOS) current source transistors that can be used to source the DAC current $I_{DAC}$ and an array of n-type metal oxide semiconductor (NMOS) current source transistors that can be used to sink current, and the digital input signal DIN can be used to selectively turn on and off transistors in the arrays to control the magnitude and polarity of the DAC current $I_{DAC}$. As used herein and as persons having ordinary skill in the art will appreciate, MOS transistors can also have gates made out of materials that are not metals, such as poly silicon, and can have dielectric regions implemented not just with silicon oxide, but with other dielectrics, such as high-k dielectrics.

In the illustrated configuration, the transmission line 203 is terminated at the receiver side using the termination circuit 204. In one example, the termination circuit 204 can have a resistance selected to be about 50 Ω. However, other termination impedance values of the termination circuit 204 can be used. For example, depending on the embodiment, the termination impedance value of the termination circuit 204 can be in the range of from between about 10 Ω and 150 Ω, between about 20 Ω and 100 Ω, between about 30 Ω and 80 Ω, between about 40 Ω and 70 Ω, between about 45 Ω and 55 Ω. In some embodiments, the impedance value is less than 10 Ω and higher than 150 Ω. The termination circuit 204 can help prevent high frequency signals generated by the DAC transmitter 201 from being reflected back from the receiver 202, thereby reducing reflections and/or power losses.

As shown in FIG. 2A, the DAC 205 includes an active termination circuit 207, which can be used to provide output matching or termination between the DAC's output and the transmission line 203. As used herein, "active termination" can refer to termination provided at least in part using active devices, such as transistors, rather than exclusively by passive devices, such as resistors.

Using active termination can improve power performance relative to a configuration using passive termination. For example, a small signal resistance looking into the output of the DAC 205 can have a resistance selected for proper output impedance matching or termination, while an on-state resistance of the DAC 205 can be relatively small. For instance, in one embodiment, the small signal resistance looking into the output of the DAC 205 can be selected to be about equal to 50 Ω, while an on-state resistance of the DAC 205 can be much less than 50 Ω. In another embodiment, the small signal resistance looking into the output of the DAC 205 can be selected to be about equal to 75 Ω, while an on-state resistance of the DAC 205 can be much less than 75 Ω. Accordingly, active termination can provide output impedance matching with reduced power consumption.

As persons having ordinary skill in the art will appreciate, a MOS transistor can be biased at a DC operating point, such as a DC operating point associated with a particular drain-to-source voltage ($V_{DS}$) and drain-to-source current ($I_{DS}$). As used herein, a small signal resistance of a MOS transistor can refer to a channel resistance of the MOS transistor for small signal perturbations about the transistor's DC operating point, for instance, $V_{DS}$ perturbations of less than about 300 mV.

The active termination circuit 207 can include one or more PMOS termination transistors 208 and one or more NMOS termination transistors 209, which can be biased to actively terminate the DAC's output. For example, the one or more PMOS termination transistors 208 can be biased using the first bias voltage $V_{BIAS1}$ and the one or more NMOS termination transistors 209 can be biased using the second bias voltage $V_{BIAS2}$ such that a small signal resistance looking into the output of the DAC 205 is about equal to a desired termination resistance.

Figure 2B:
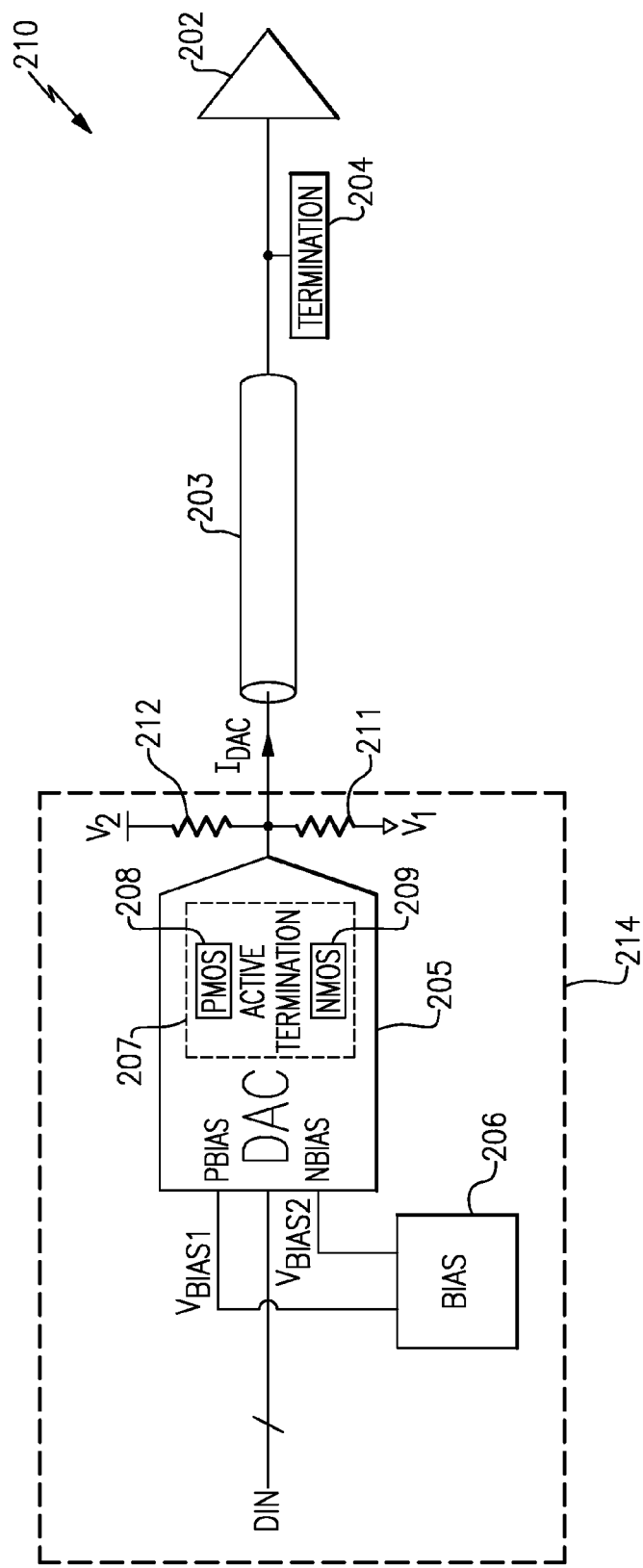
FIG. 2B is a schematic block diagram of an electronic system according to another embodiment.

FIG. 2B is a schematic block diagram of an electronic system 210 according to another embodiment.

The electronic system 210 of FIG. 2B is similar to the electronic system 200 of FIG. 2A, except that the electronic system 210 of FIG. 2A includes a DAC transmitter 214, which is implemented in a different configuration relative to the DAC transmitter 201 of FIG. 2A.

In particular, the DAC transmitter 214 of FIG. 2B further includes a first output termination resistor 211 and a second output termination resistor 202. The first output termination resistor 211 is electrically connected between the output of the DAC 205 and a first supply voltage $V_1$, and the second output termination resistor 212 is electrically connected between the output of the DAC 205 and the second supply voltage $V_2$.

Thus, in certain configurations herein including the embodiment of FIG. 2B, a DAC includes a combination of active devices, such as transistors, and passive devices, such as resistors, used to provide output termination. Configuring a DAC to include both active devices and passive devices can provide enhanced design flexibility and can aid in achieving a desired termination impedance for a particular DAC circuit topology and/or fabrication process. Additional details of the electronic system 210 of can be similar to those described earlier.

Figure 2C:
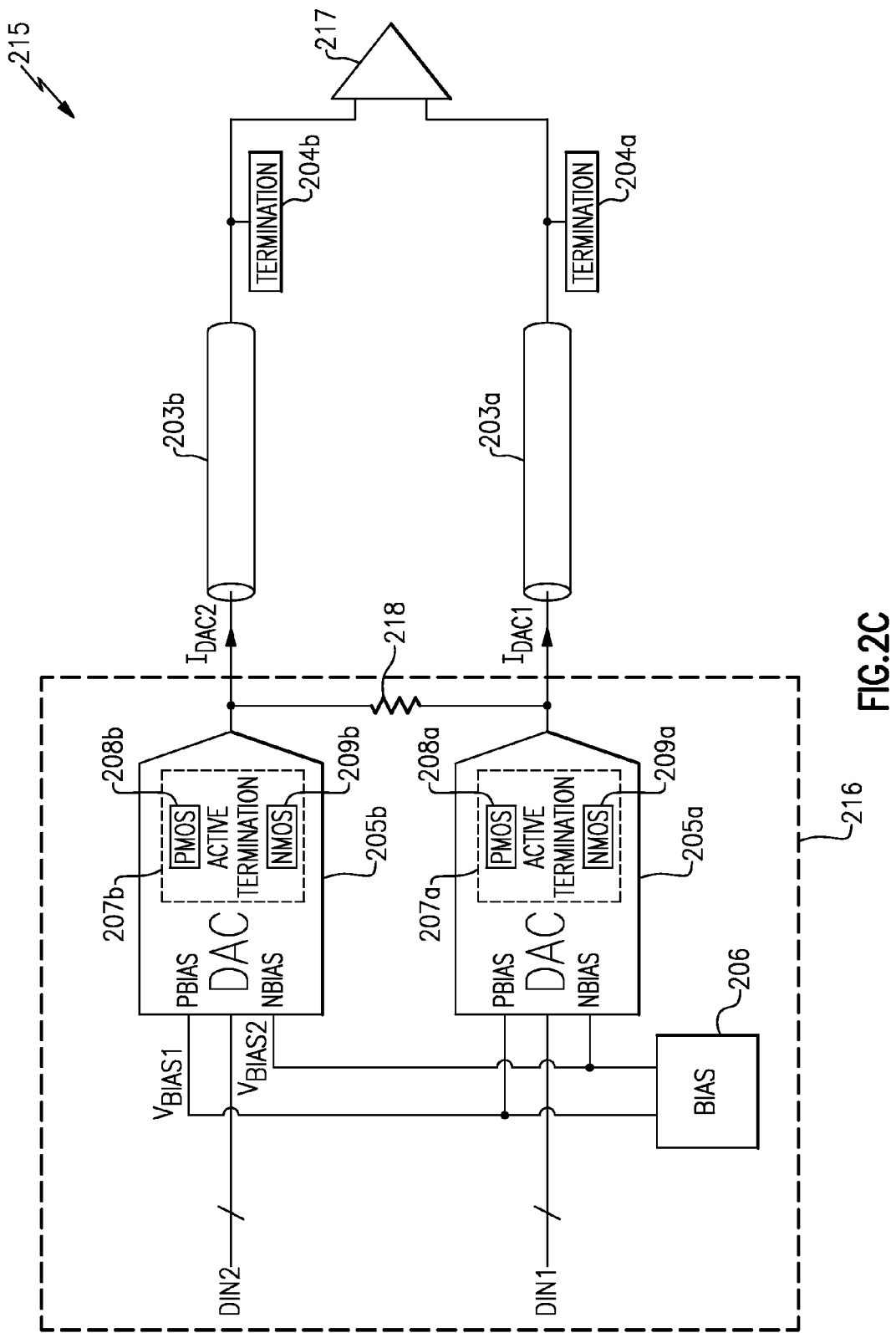
FIG. 2C is a schematic block diagram of an electronic system according to another embodiment.

FIG. 2C is a schematic block diagram of an electronic system 215 according to another embodiment. The electronic system 215 includes a DAC transmitter 216, a first transmission line 203a, a second transmission line 203b, a differential receiver 217, a first termination circuit 204a, and a second termination circuit 204b.

The illustrated transmitter DAC 216 includes a first DAC 205a, a second DAC 205b, a bias circuit 206, and an output termination resistor 218. The first DAC 205a includes a data input that receives a first digital input signal DIN1 and an output electrically connected to a first end of the first transmission line 203a and to a first end of the output termination resistor 218. The first DAC 205a further includes a PBIAS input that receives a first bias voltage $V_{BIAS1}$ generated by the bias circuit 206, and an NBIAS input that receives a second bias voltage $V_{BIAS2}$ generated by the bias circuit 206. The first transmission line 203a further includes a second end electrically connected to the first termination circuit 204a and to a first input of the differential receiver 217. The second DAC 205b includes a data input that receives a second digital input signal DIN2 and an output electrically connected to a first end of the second transmission line 203b and to a second end of the output termination resistor 218. The second DAC 205b further includes a PBIAS input that receives the first bias voltage $V_{BIAS1}$, and an NBIAS input that receives the second bias voltage $V_{BIAS2}$. The second transmission line 203b further includes a second end electrically connected to the second termination circuit 204b and to a second input of the differential receiver 217.

The electronic system 215 of FIG. 2C is similar to the electronic system 200 of FIG. 2A, except that the electronic system 215 is implemented in a differential configuration. As shown in FIG. 2C, the first DAC 205a includes a first active termination circuit 207a, which includes one or more PMOS termination transistors 208a and one or more NMOS termination transistors 209a. Similarly, the second DAC 205b includes a second active termination circuit 207b, which includes one or more PMOS termination transistors 208b and one or more NMOS termination transistors 209b. The bias circuit 206 can control the voltage levels of the first and second bias voltages $V_{BIAS1}$, $V_{BIAS2}$ so as to control a small signal resistance of transistors of the first and second active termination circuits 207a, 207b.

In the illustrated configuration, the transmitter 206 further includes the output termination resistor 218, which can operate in conjunction with the first and second active termination circuits 207a, 207b to terminate the outputs of the first and second DACs 205a, 205b. Although FIG. 2C illustrates a configuration including the output termination resistor 218, in certain implementations the output termination resistor 218 can be omitted.

Additional details of the electronic system 215 of FIG. 2C can be similar to those described earlier.

Figure 3:
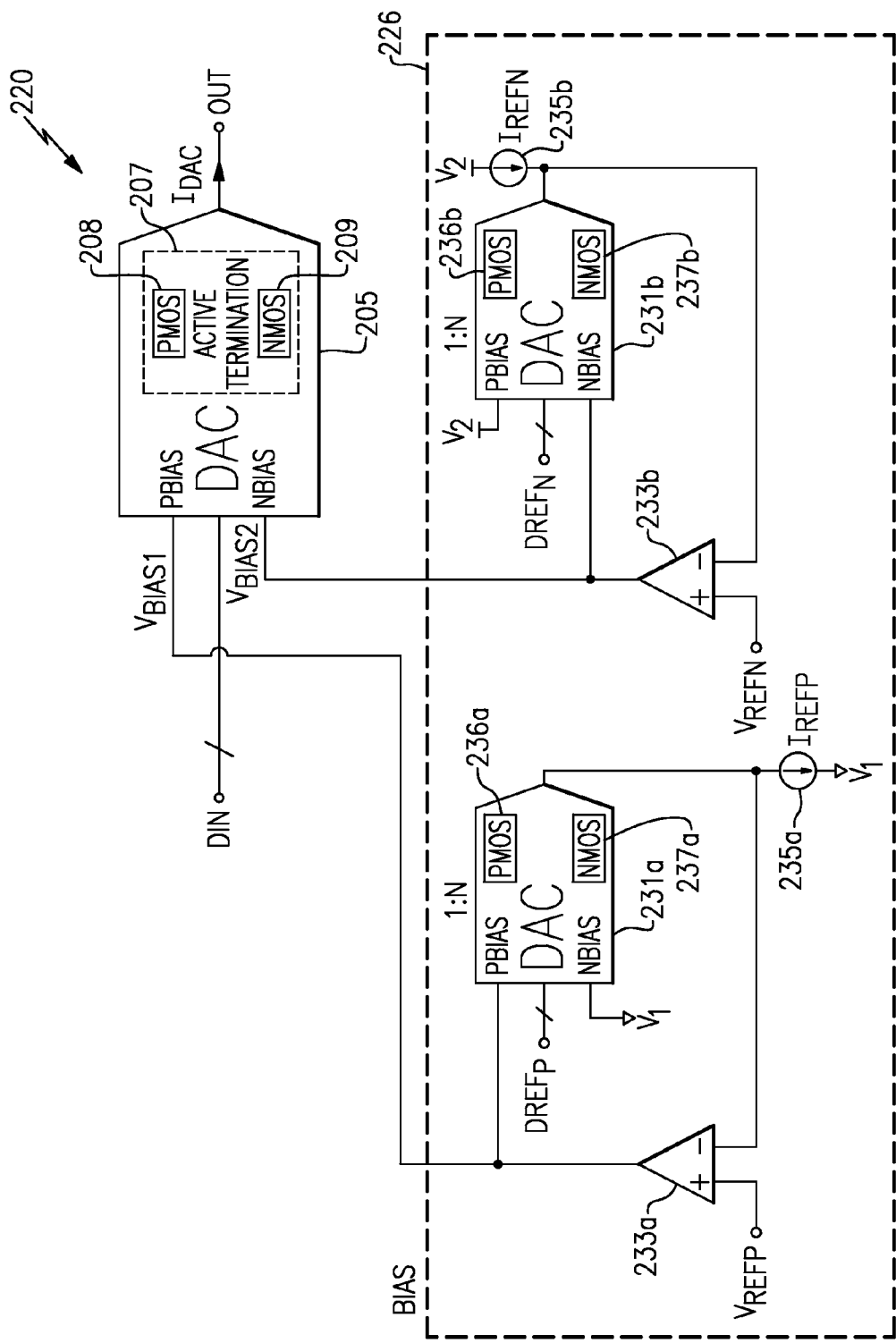
FIG. 3 is a schematic block diagram of a digital-to-analog converter (DAC) transmitter according to one embodiment.

FIG. 3 is a schematic block diagram of a DAC transmitter 220 according to one embodiment. The DAC transmitter 220 includes the DAC 205, which can be as described earlier. The DAC transmitter 220 further includes a bias circuit 226 including a first replica DAC 231a, a first amplifier 233a, a first current source 235a, a second replica DAC 231b, a second amplifier 233b, and a second current source 235b.

The first replica DAC 231a includes a first bias input or PBIAS input that receives the first bias voltage $V_{BIAS1}$, a second bias input or NBIAS input electrically connected to the first supply voltage $V_1$, a data input that receives a first digital reference signal $DREF_P$, and an output. The first amplification circuit 233a includes a non-inverting input that receives a first reference voltage $V_{REFP}$, an inverting input electrically connected to the output of the first replica DAC 231a, and an output that generates the first bias voltage $V_{BIAS1}$. The first current source 235a is electrically connected between the output of the first replica DAC 231a and the first supply voltage $V_1$, and generates a first reference current $I_{REFP}$ that is sourced by the output of the first replica DAC 231a. The second replica DAC 231b includes a PBIAS input electrically connected to the second supply voltage $V_2$, an NBIAS input that receives the second bias voltage $V_{BIAS2}$, a data input that receives a second digital reference signal $DREF_N$, and an output. The second amplification circuit 233b includes a non-inverting input that receives a second reference voltage $V_{REFN}$, an inverting input electrically connected to the output of the second replica DAC 231b, and an output that generates the second bias voltage $V_{BIAS2}$. The second current source 235b is electrically connected between the output of the second replica DAC 231b and the second supply voltage $V_2$, and generates a second reference current $I_{REFN}$ that is sunk by the output of the second replica DAC 231b.

The first replica DAC 231a can be implemented to include a replica or copy of at least a portion of the DAC 205. Similarly, the second replica DAC 231b can be implemented to include a replica or copy of at least a portion of the DAC 205. By implementing the first and second replica DACs 231a, 231b as replicas of at least a portion of the DAC 205, the first and second replica DACs 231a, 231b can have a circuit operation that tracks that of the DAC 205 across process, voltage, and/or temperature variation. However, implementing the first and second replica DACs 231a, 231b as full copies or replicas of the DAC 205 can also increase power consumption and/or area, and thus in certain configurations the first and second replica DACs 231a, 231b can be scaled-down in size relative to the size of the DAC 205. For example, in one embodiment, the DAC 205 includes j bits, and the first and second replica DACs 231a, 231b include k bits, where k is less than j. However, other configurations are possible.

As shown in FIG. 3, the first DAC 231a includes replica PMOS termination transistors 236a and replica NMOS termination transistors 237a, and the second DAC 231b includes replica PMOS termination transistors 236b and replica NMOS termination transistors 237b. The replica PMOS termination transistors 236a and the replica PMOS termination transistors 236b can be replicas of at least a portion of the PMOS termination transistors 208 of the DAC 205. Similarly, the replica NMOS termination transistors 237a and the replica NMOS termination transistors 237b can be replicas of at least a portion of the NMOS termination transistors 209 of the DAC 205.

As shown in FIG. 3, the NBIAS input of the first replica DAC 231a is electrically connected to the first supply voltage $V_1$, which can operate to turn off the replica NMOS termination transistors 237a. However, the PBIAS input of the first replica DAC 231a receives the first bias voltage $V_{BIAS1}$, which can be used to control a small signal resistance of the replica PMOS termination transistors 236a. Additionally, the PBIAS input of the second replica DAC 231b is electrically connected to the second supply voltage $V_2$, which can operate to turn off the replica PMOS termination transistors 236b. However, the NBIAS input of the second replica DAC 231b receives the second bias voltage $V_{BIAS2}$, which can be used to control a small signal resistance of the replica NMOS termination transistors 237b.

The bias circuit 226 can be used to control the voltage levels of the first and second bias voltages $V_{BIAS1}$, $V_{BIAS2}$ to control a small signal resistance of the active termination circuit 207 of the DAC 205.

For example, the first amplifier 233a operates with negative feedback, and can control the first bias voltage $V_{BIAS1}$ such that the output of the first replica DAC 231a has a voltage about equal to the first reference voltage $V_{REFP}$ and such that the first replica DAC 231a sources a current about equal to the first reference current $I_{REFP}$. Similarly, the second amplifier 233b operates with negative feedback, and can control the second bias voltage $V_{BIAS2}$ such that the output of the second replica DAC 231b has a voltage about equal to the second reference voltage $V_{REFN}$ and such that the second replica DAC 231b sinks a current about equal to the second reference current $I_{REFN}$.

In steady-state, the replica PMOS termination transistors 236a of the first replica DAC 231a can be biased based on the first reference current $I_{REFP}$ and the first reference voltage $V_{REFP}$, and the replica NMOS termination transistors 237b of the second replica DAC 231b can be biased based on the second reference current $I_{REFN}$ and the second reference voltage $V_{REFN}$.

By selecting the values of the first reference current $I_{REFP}$ and the first reference voltage $V_{REFP}$, the small signal resistance of the replica PMOS termination transistors 236a can be controlled. Likewise, by selecting the values of the second reference current $I_{REFN}$ and the second reference voltage $V_{REFN}$, the small signal resistance of the replica NMOS termination transistors 237b can be controlled. Since the replica PMOS termination transistors 236a can be replicas of the PMOS termination transistors 208 of the active termination circuit 207, controlling the small signal resistance of the replica PMOS termination transistors 236a can also control the small signal resistance of the PMOS termination transistors 208. Similarly, since the replica NMOS termination transistors 237b can be replicas of the NMOS termination transistors 209 of the DAC 205, controlling the small signal resistance of the replica NMOS termination transistors 237b can also control the small signal resistance of the NMOS termination transistors 209.

Accordingly, the illustrated bias circuit 226 can be used to control a small signal resistance of the PMOS termination transistors 208 and a small signal resistance of the NMOS termination transistors 209, thereby controlling an impedance of the active termination circuit 207. In one embodiment, the values of the first reference current $I_{REFP}$ and the first reference voltage $V_{REFP}$ are selected such that the replica PMOS termination transistors 236a operate in a saturation region or saturation, and the values of the second reference current $I_{REFN}$ and the second reference voltage $V_{REFN}$ are selected such that the replica NMOS termination transistors 237b operate in saturation.

As shown in FIG. 3, the first replica DAC 231a receives the first digital reference signal $DREF_P$, which can be used to control a number of active transistors in the first replica DAC 231a. Similarly, the second replica DAC 231b receives the second digital reference signal $DREF_N$, which can be used to control a number of active transistors in the second replica DAC 231b. Implementing the first and second replica DACs 231a, 231b to receive the first and second digital reference signals $DREF_P$, $DREF_N$, respectively, can aid in digitally controlling a tradeoff between the bias circuit's accuracy and power consumption. For example, activating a relatively large number of transistors of the first and second replica DACs 231a, 231b using the first and second digital reference signals $DREF_P$, $DREF_N$ can increase power consumption, but can also enhance biasing accuracy and improve output matching.

Although FIG. 3 illustrates a configuration in which the first and second replica DACs 231a, 231b receive the first and second digital reference signals $DREF_P$, $DREF_N$, respectively, other configurations are possible. For example, in one embodiment, the first and/or second replica DACs 231a, 231b are hard-wired with specific data input values.

Figure 4:
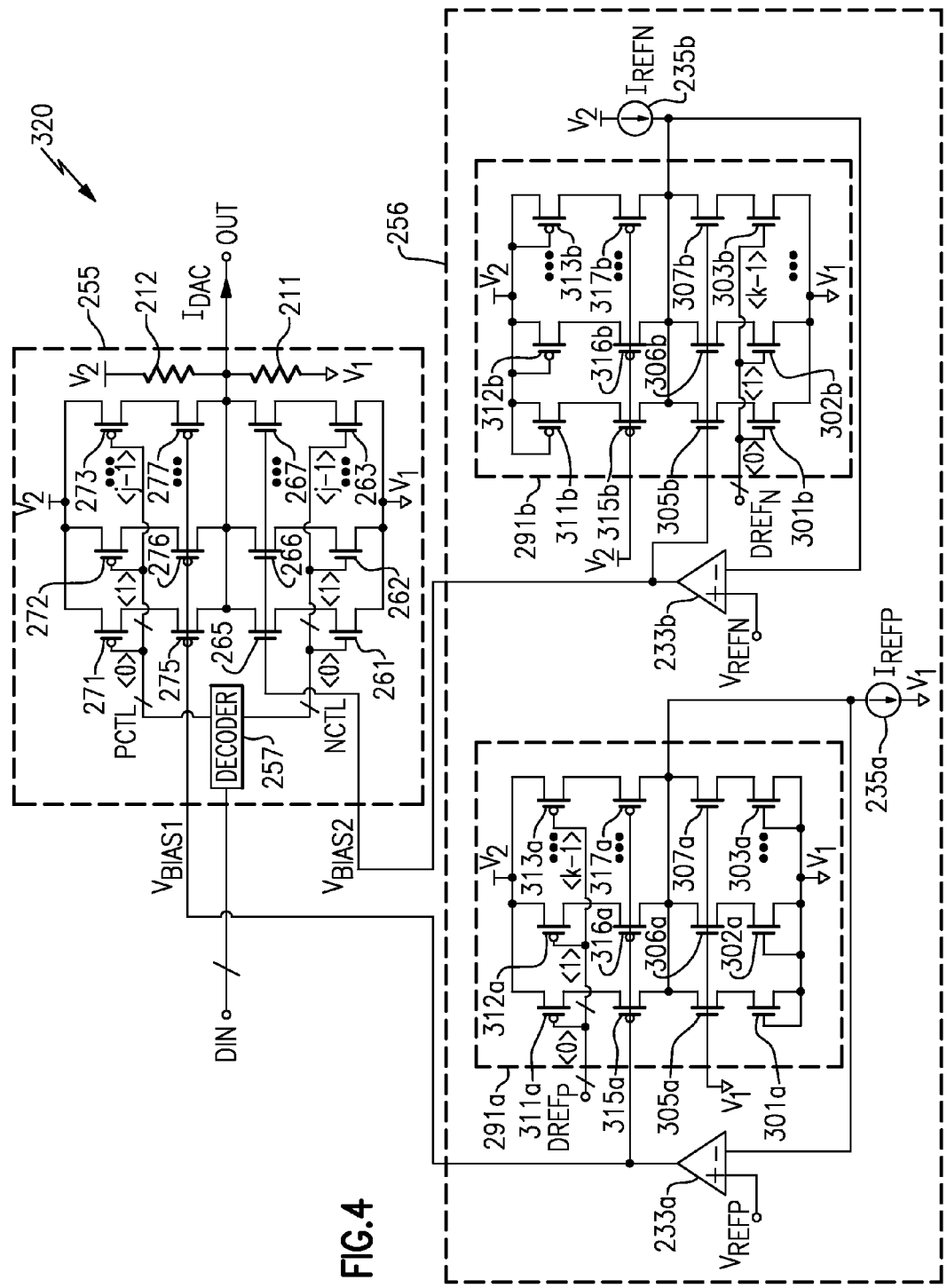
FIG. 4 is a schematic block diagram of a DAC transmitter according to another embodiment.

FIG. 4 is a schematic block diagram of a DAC transmitter 320 according to another embodiment. The DAC transmitter 320 includes a DAC 255 and a bias circuit 256. The DAC 255 includes a data input that receives a digital input signal DIN, a PBIAS input that receives a first bias voltage $V_{BIAS1}$ from the bias circuit 256, an NBIAS input that receives a second bias voltage $V_{BIAS2}$ from the bias circuit 256, and an output configured to drive a transmission line.

The DAC 255 includes a decoder 257, a first NMOS current source transistor 261, a second NMOS current source transistor 262, a third NMOS current source transistor 263, a first NMOS termination transistor 265, a second NMOS termination transistor 266, a third NMOS termination transistor 267, a first PMOS current source transistor 271, a second PMOS current source transistor 272, a third PMOS current source transistor 273, a first PMOS termination transistor 275, a second PMOS termination transistor 276, a third PMOS termination transistor 277, and first and second termination resistors 211, 212.

Although FIG. 4 illustrates a configuration in which the DAC 255 is implemented as a 3-bit DAC, the DAC 255 can be implemented to include more or fewer bits.

In the configuration shown in FIG. 4, the first to third NMOS current source transistors 261-263 and the first to the first to third NMOS termination transistors 265-267 are electrically connected in a cascode configuration. For example, the first NMOS current source transistor 261 and the first NMOS termination transistor 265 are electrically connected in series between the first supply voltage $V_1$ and the output of the DAC 255. Likewise, the second NMOS current source transistor 262 and the second NMOS termination transistor 266 are electrically connected in series between the first supply voltage $V_1$ and the DAC's output, and the third NMOS current source transistor 263 and the third NMOS termination transistor 267 are electrically connected in series between the first supply voltage $V_1$ and the DAC's output. Similarly, the first to third PMOS current source transistors 271-273 and the first to the first to third PMOS termination transistors 275-277 are electrically connected in a cascode configuration between the second supply voltage $V_2$ and the DAC's output.

As shown in FIG. 4, the first to third NMOS termination transistors 265-267 include gates biased using the second bias voltage $V_{BIAS2}$, and the first to third PMOS termination transistors 275-277 include gates biased using the first bias voltage $V_{BIAS1}$.

Additionally, the illustrated DAC 255 includes the decoder 257, which decodes the digital input signal DIN to generate a digital NMOS control signal NCTL and a digital PMOS control signal PCTL. As shown in FIG. 4, different bits of the digital NMOS control signal NCTL can be used to control the gates of the first to third NMOS current source transistors 261-263, and different bits of the digital PMOS control signal PCTL can be used to control the gates of the first to third PMOS current source transistors 271-273. In certain configurations, the first to third NMOS current source transistors 261-263 have different transistor widths or sizes relative to one another, and thus the bits of the digital NMOS control signal NCTL can be associated with different output current weights. Similarly, in certain configurations, the first to third PMOS current source transistors 271-273 have different transistor widths or sizes relative to one another, and thus the bits of the digital PMOS control signal PCTL can be associated with different output current weights. Although FIG. 4 illustrates a configuration using the decoder 257, in certain configurations the decoder 257 can be omitted in favor of controlling NMOS and/or PMOS current source transistors using bits of the digital input signal DIN.

In one embodiment, the decoder 257 is configured to generate the digital PMOS control signal PCTL and the digital NMOS control signal NTL to control the DAC 255 into one of a plurality of DAC states, and each DAC state is associated with about the same small signal resistance looking into the DAC's output. Configuring the decoder 257 in this manner can aid in maintaining active termination for different digital input signal values. In another embodiment, the decoder 257 is omitted, and the digital input signal DIN directly controls the NMOS current source transistors 261-263 and the PMOS current source transistors 271-273. In such a configuration, the small signal resistance looking into the output of the DAC 255 can be about the same for each value of the digital input signal DIN, since an equal number of transistors can be active for each digital input signal value.

The illustrated bias circuit 256 includes the first and second current sources 235a, 235b and the first and second amplifiers 233a, 233b, which can be as described earlier. The bias circuit 256 further includes a first replica DAC 291a and a second replica DAC 291b.

The first replica DAC 291a includes a first NMOS current source transistor 301a, a second NMOS current source transistor 302a, a third NMOS current source transistor 303a, a first NMOS termination transistor 305a, a second NMOS termination transistor 306a, a third NMOS termination transistor 307a, a first PMOS current source transistor 311a, a second PMOS current source transistor 312a, a third PMOS current source transistor 313a, a first PMOS termination transistor 315a, a second PMOS termination transistor 316a, and a third PMOS termination transistor 317a. The second replica DAC 291b includes a first NMOS current source transistor 301b, a second NMOS current source transistor 302b, a third NMOS current source transistor 303b, a first NMOS termination transistor 305b, a second NMOS termination transistor 306b, a third NMOS termination transistor 307b, a first PMOS current source transistor 311b, a second PMOS current source transistor 312b, a third PMOS current source transistor 313b, a first PMOS termination transistor 315b, a second PMOS termination transistor 316b, and a third PMOS termination transistor 317b.

The gates of the first to third PMOS termination transistors 315a, 316a, 317a of the first replica DAC 291a receive the first bias voltage $V_{BIAS1}$, and the gates of the first to third PMOS current source transistors 311a, 312a, 313a of the first replica DAC 291a are controlled using different bits of the first digital reference signal $DREF_P$. Additionally, the gates of the first to third NMOS current source transistors 301a, 302a, 303a and the gates of the first to third NMOS termination transistors 305a, 306a, 307a are electrically connected to the first supply voltage $V_1$ to turn off these transistors. Furthermore, the gates of the first to third NMOS current source transistors 301b, 302b, 303b of the second replica DAC 291b receive the second bias voltage $V_{BIAS2}$, and the gates of the first to third NMOS termination transistors 305b, 306b, 307b of the second replica DAC 291b are controlled using different bits of the second digital reference signal $DREF_N$. Additionally, the gates of the first to third PMOS termination transistors 315b, 316b, 317b and the gates of the first to third PMOS current source transistors 311b, 312b, 313b are electrically connected to the second supply voltage $V_2$ to turn off these transistors.

In certain configurations, the first and second replica DACs 291a, 291b include a fewer number of transistors relative to the DAC 255. For example, the DAC 255 can be implemented as a DAC including j bits, and the first and second replica DACs 291a, 291b can include k bits, where k is less than j. However, other configurations are possible.

Additional details of the DAC transmitter 320 can be similar to those described earlier.

Figure 5:
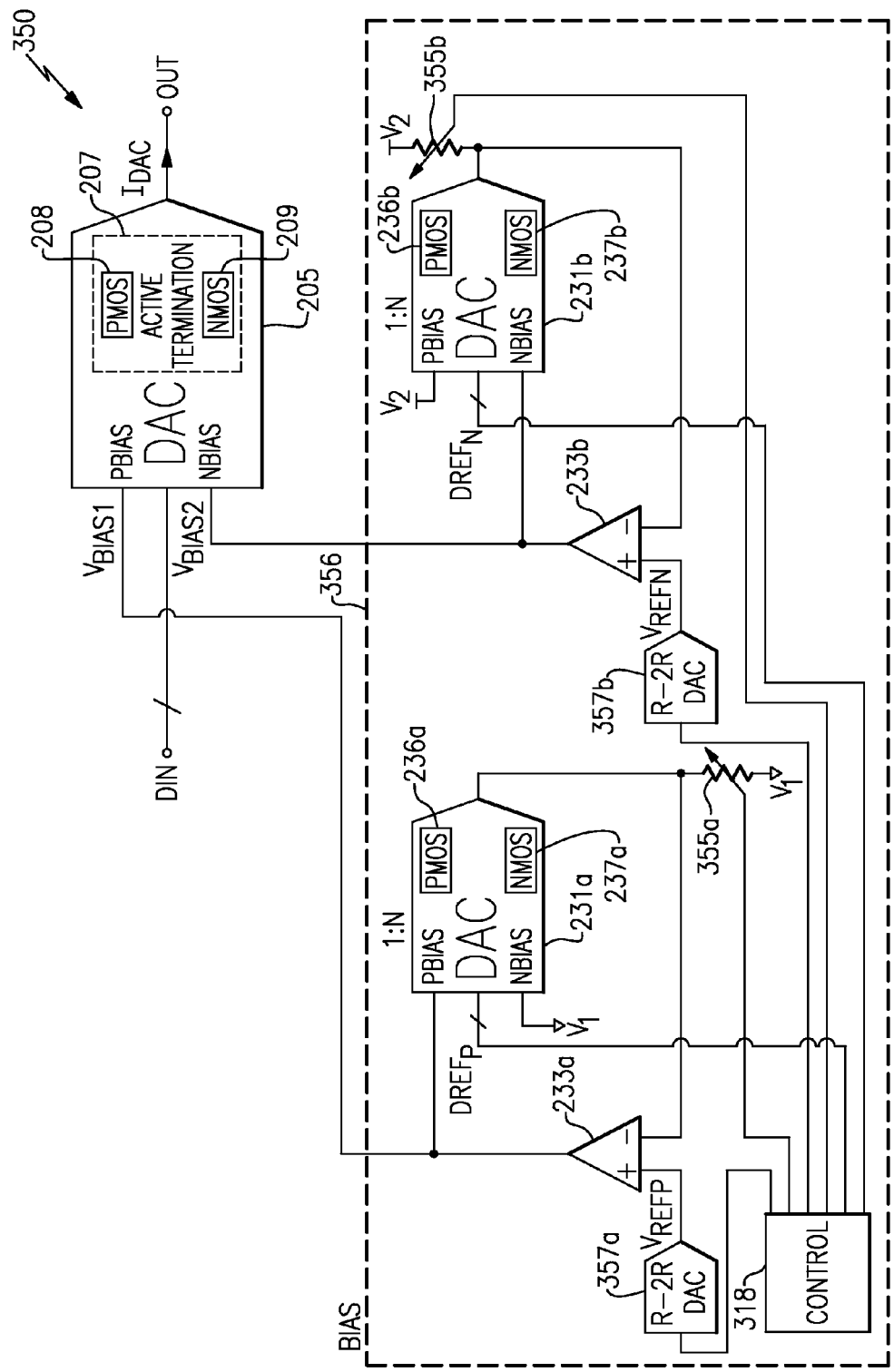
FIG. 5 is a schematic block diagram of a DAC transmitter according to another embodiment.

FIG. 5 is a schematic block diagram of a DAC transmitter 350 according to another embodiment. The DAC transmitter 350 of FIG. 5 is similar to the DAC transmitter 220 of FIG. 3, except that the DAC transmitter 350 of FIG. 5 includes a different implementation of a bias circuit 356.

For example, the illustrated bias circuit 356 includes the first and second replica DACs 231a, 231b and the first and second amplifiers 233a, 233b, which can be as described earlier. However, the bias circuit 356 illustrates a configuration including first and second current sources implemented as first and second programmable resistors 355a, 355b, respectively. Additionally, the bias circuit 356 further includes a first R-2R DAC 357a that generates the first reference voltage $V_{REFP}$, a second R-2R DAC 357b that generates the second reference voltage $V_{REFN}$, and a control circuit 318.

As shown in FIG. 5, the control circuit 318 can be used to control a value of digital inputs to the first and second R-2R DACs 357a, 357b, respectively, thereby controlling the values of the first and second reference voltages $V_{REFP}$, $V_{REFN}$. Additionally, the control circuit 318 can be used to control resistance values of the first and second programmable resistors 355a, 355b. Since the voltage across the first programmable resistor 355a can be about equal to $V_{REFP}-V_1$ and the voltage across the second programmable resistor 355b can be about equal to $V_2-V_{REFN}$, controlling the resistance values of the first and second programmable resistors 355a, 355b can also control the magnitude of currents through the resistors. Furthermore, the control circuit 318 can be used to control the values of the first and second digital reference signals $DREF_P$, $DREF_N$, respectively, which can provide digital control over a tradeoff between biasing accuracy and power consumption.

In certain implementations, the control circuit 318 can include a programmable memory storing data used to control values of digital inputs to the first and second R-2R DACs 357a, 357b, resistance values of the first and second programmable resistors 355a, 355b, and/or values of the first and second digital reference signals $DREF_P$, $DREF_N$. In one example, the programmable memory can include a non-volatile memory programmed with the data during manufacture. In another example, the programmable memory can include a volatile memory, and the data can be programmed into the programmable memory during chip power-up and/or during a calibration cycle. However, other configurations are possible.

Figure 6:
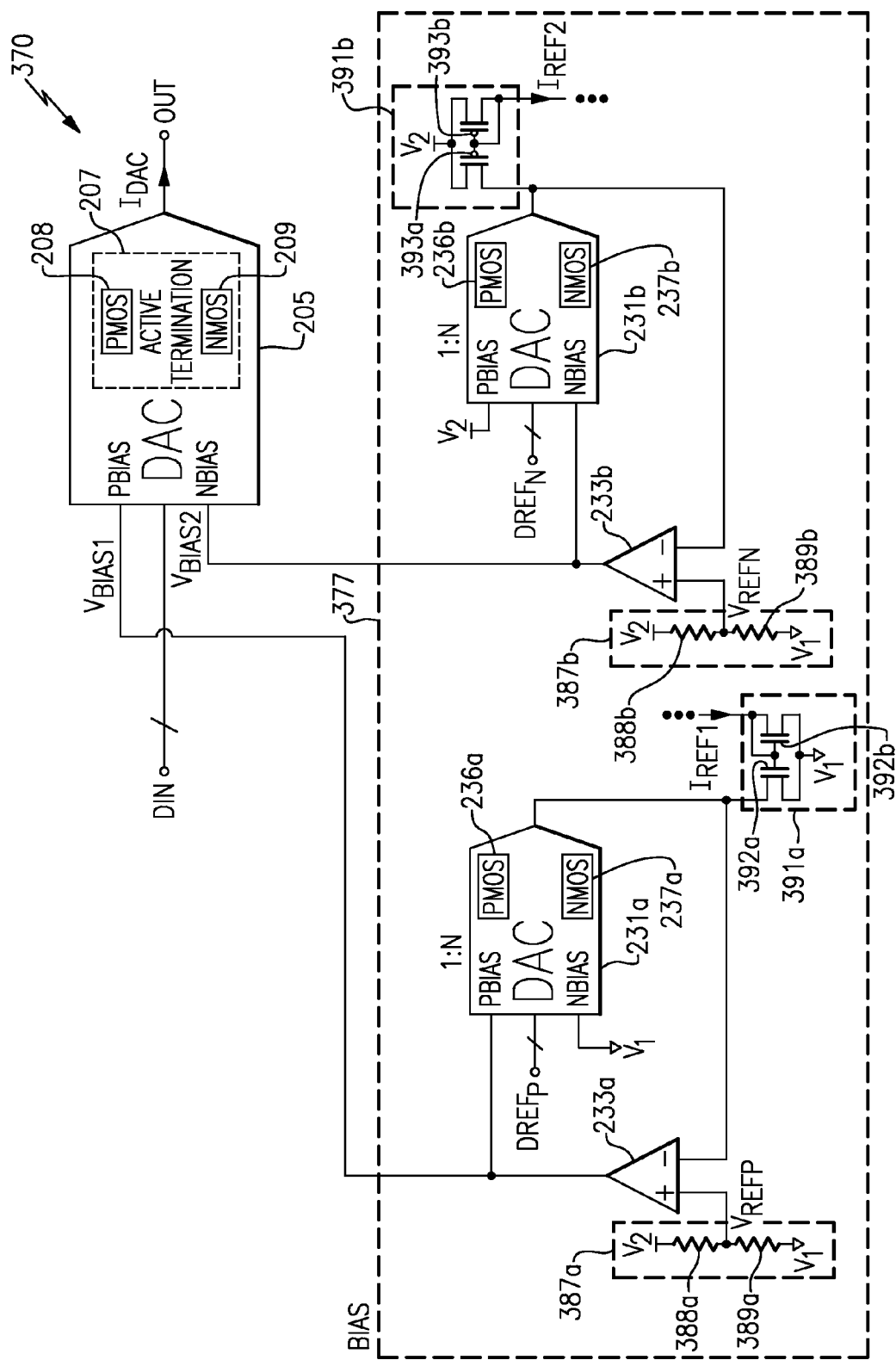
FIG. 6 is a schematic block diagram of a DAC transmitter according to another embodiment.

FIG. 6 is a schematic block diagram of a DAC transmitter 370 according to another embodiment. The DAC transmitter 370 of FIG. 6 is similar to the DAC transmitter 220 of FIG. 3, except that the DAC transmitter 370 of FIG. 6 includes a different implementation of a bias circuit 377.

For example, the bias circuit 377 includes the first and second replica DACs 231a, 231b and the first and second amplifiers 233a, 233b, which can be as described earlier. However, the bias circuit 377 illustrates a configuration including first and second current sources implemented as first and second current mirrors 391a, 391b, respectively. Additionally, the bias circuit 377 further includes a first resistor voltage divider 387a that generates the first reference voltage $V_{REFP}$ and a second resistor voltage divider 387b that generates the second reference voltage $V_{REFN}$.

As shown in FIG. 6, the first current mirror 391a includes a first NMOS current mirror transistor 392a and a second NMOS current mirror transistor 392b. As shown in FIG. 6, the gate of the first NMOS current mirror transistor 392a is electrically connected to the gate and drain of the second NMOS current mirror transistor 392b. Additionally, the drain of the second NMOS current mirror transistor 392b receives a first reference current $I_{REF1}$, which can be mirrored or replicated with or without scaling at the drain of the first NMOS current mirror transistor 392a. Additionally, the second current mirror 391b includes a first PMOS current mirror transistor 393a and a second PMOS current mirror transistor 393b. As shown in FIG. 6, the gate of the first PMOS current mirror transistor 393a is electrically connected to the gate and drain of the second PMOS current mirror transistor 393b. Additionally, the drain of the second PMOS current mirror transistor 393b receives a second reference current $I_{REF2}$, which can be mirrored or replicated with or without scaling at the drain of the first PMOS current mirror transistor 393a.

The first resistor voltage divider 387a includes a first resistor 388a and a second resistor 389a electrically connected in series between the first and second supply voltages $V_1$, $V_2$. Additionally, first resistor voltage divider 387a includes an output that generates the first reference voltage $V_{REFP}$, which can be controlled by selecting a ratio of a resistance of the first resistor 388a to a resistance of the second resistor 389a. Furthermore, the second resistor voltage divider 387b includes a first resistor 388b and a second resistor 389b electrically connected in series between the first and second supply voltages $V_1$, $V_2$. Additionally, the second resistor voltage divider 387b includes an output that generates the second reference voltage $V_{REFN}$, which can be controlled by selecting a ratio of a resistance of the first resistor 388b to a resistance of the second resistor 389b.

Additional details of the DAC transmitter 370 of FIG. 6 can be similar to those described earlier.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus comprising:
  a first digital-to-analog converter (DAC) including a data input configured to receive a digital input signal and an output configured to generate an output current, wherein the first DAC comprises an active termination circuit including one or more MOS termination transistors; and
  a bias circuit configured to generate a first bias voltage, wherein the first bias voltage is configured to control a small signal resistance of the one or more MOS termination transistors,
  wherein the one or more MOS termination transistors provide active termination to the output of the first DAC.

2. The apparatus of claim 1, wherein the bias circuit comprises:
  a replica DAC comprising one or more replica termination transistors biased by the first bias voltage, wherein the replica DAC comprises a replica of at least a portion of the first DAC.

3. The apparatus of claim 2, wherein the replica DAC further comprises a data input configured to receive a digital reference signal, wherein the digital reference signal is operable to digitally control a tradeoff between biasing accuracy and power consumption.

4. The apparatus of claim 2, wherein the bias circuit further comprises:
  a current source configured to generate a reference current, wherein the one or more replica termination transistors are biased based on the reference current.

5. The apparatus of claim 4, wherein the reference current biases the one or more replica termination transistors in saturation.

6. The apparatus of claim 1, further comprising:
  a first output termination resistor electrically connected between the output of the first DAC and a first supply voltage; and
  a second output termination resistor electrically connected between the output of the first DAC and a second supply voltage,
  wherein the first and second output termination resistors operate in combination with the one or more MOS termination transistors to terminate the output of the first DAC.

7. The apparatus of claim 1, further comprising:
  a second DAC including a data input and an output, wherein the second DAC comprises an active termination circuit including one or more MOS termination transistors, wherein the first bias voltage is further configured to control a small signal resistance of the one or more MOS termination transistors of the active termination circuit of the second DAC; and
  an output termination resistor electrically connected between the output of the first DAC and the output of the second DAC.

8. The apparatus of claim 1, wherein the first DAC comprises:
  a plurality of p-type metal oxide semiconductor (PMOS) current source transistors configured to source current; and
  a plurality of n-type metal oxide semiconductor (NMOS) current source transistors configured to sink current, wherein the plurality of PMOS current source transistors and the plurality of NMOS current source transistors are selectable based on a value of the digital input signal.

9. The apparatus of claim 1, further comprising:
  a transmission line including a first end electrically connected to the output of the first DAC; and
  a receiver including an input electrically connected to a second end of the transmission line.

10. The apparatus of claim 1, wherein the one or more MOS termination transistors comprises one or more NMOS termination transistors.

11. The apparatus of claim 1, wherein the one or more MOS termination transistors comprises one or more PMOS termination transistors.

12. The apparatus of claim 11, wherein the active termination circuit further includes one or more NMOS termination transistors, wherein the bias circuit is further configured to generate a second bias voltage that controls a small signal resistance of the one or more NMOS termination transistors, wherein the one or more NMOS termination transistors and the one or more PMOS termination transistors provide active termination to the output of the first DAC.

13. A method of electrical termination, the method comprising:
  generating a first bias voltage using a bias circuit;
  biasing at least one metal oxide semiconductor (MOS) termination transistor of a digital to analog converter (DAC) using the first bias voltage; and
  providing active termination to an output of the DAC based on a small signal resistance of the at least one MOS termination transistor.

14. The method of claim 13, wherein generating the first bias voltage comprises:
  generating a reference current using a current source; and
  biasing one or more replica termination transistors of a replica DAC based on the reference current, wherein the replica DAC comprises a replica of at least a portion of the DAC.

15. The method of claim 14, wherein generating the first bias voltage further comprises:
  biasing the one or more replica termination transistors using the first bias voltage;
  controlling an output voltage of the replica DAC to substantially equal a reference voltage using an amplifier operating with negative feedback; and
  generating the first bias voltage at an output of the amplifier.

16. The method of claim 14, further comprising biasing the one or more replica termination transistors in saturation using the reference current.

17. The method of claim 14, further comprising
  providing a digital reference signal to a data input of the replica DAC; and digitally control a tradeoff between biasing accuracy and power consumption based on a value of the digital reference signal.

18. The method of claim 13, wherein biasing the at least one MOS termination transistor of the DAC using the first bias voltage comprises biasing one or more PMOS termination transistors, wherein the method further comprises:
generating a second bias voltage using the bias circuit;
biasing one or more NMOS termination transistors of the DAC using the second bias voltage; and
terminating the output of the DAC based on a small signal resistance of the one or more PMOS termination transistors and on a small signal resistance of the one or more NMOS termination transistors.

19. The method of claim 13, further comprising:
receiving a digital input signal at an input of the DAC;
generating an output current at the output of the DAC based on the digital input signal; and
providing the output current to a first end of a transmission line.

20. A transceiver comprising:
a digital-to-analog converter (DAC) including a data input configured to receive a digital input signal and an output configured to generate an output current, wherein the DAC comprises an active termination circuit including one or more MOS termination transistors; and
a means for generating a bias voltage that controls a small signal resistance of the one or more MOS termination transistors,
wherein the one or more MOS termination transistors provide active termination to the output of the DAC.

* * * * *